United States Patent
Heimgartner et al.

(10) Patent No.: US 10,096,644 B2
(45) Date of Patent: Oct. 9, 2018

(54) OPTICAL DEVICES, IN PARTICULAR COMPUTATIONAL CAMERAS, AND METHODS FOR MANUFACTURING THE SAME

(71) Applicant: Heptagon Micro Optics Pte. Ltd., Singapore (SG)

(72) Inventors: Stephan Heimgartner, Passugg (CH); Alexander Bietsch, Thalwil (CH); Hartmut Rudmann, Jona (CH); Markus Rossi, Jona (CH); Simon Gubser, Weesen (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 15/487,132

(22) Filed: Apr. 13, 2017

(65) Prior Publication Data
US 2017/0221961 A1    Aug. 3, 2017

Related U.S. Application Data

(63) Continuation of application No. 14/413,866, filed as application No. PCT/EP2013/000766 on Mar. 14, 2013, now Pat. No. 9,634,051.
(Continued)

(51) Int. Cl.
*H04N 5/225* (2006.01)
*H01L 27/146* (2006.01)
(Continued)

(52) U.S. Cl.
CPC .... *H01L 27/14687* (2013.01); *G02B 13/0085* (2013.01); *G02B 21/367* (2013.01);
(Continued)

(58) Field of Classification Search
CPC .......... G02B 13/0085; H01L 27/14687; H01L 27/14685; H01L 27/14632; H01L 27/14618; H01L 27/14625
See application file for complete search history.

(56) References Cited

U.S. PATENT DOCUMENTS

| 6,124,974 | A | * | 9/2000 | Burger | ................ | G02B 3/0056 |
| | | | | | | 359/621 |
| 6,381,072 | B1 | * | 4/2002 | Burger | ................ | G02B 3/0056 |
| | | | | | | 359/621 |

(Continued)

FOREIGN PATENT DOCUMENTS

| EP | 0 548 848 | 6/1993 |
| EP | 1 357 514 | 7/2008 |

(Continued)

OTHER PUBLICATIONS

International Search Report issued in PCT/EP2013/000766 dated Aug. 28, 2013.

*Primary Examiner* — Lin Ye
*Assistant Examiner* — John H Morehead, III
(74) *Attorney, Agent, or Firm* — Fish & Richardson P.C.

(57) ABSTRACT

A method for manufacturing one or more optical devices, each comprising a first member and a second member, and a spacer arranged between the first and second members. The method includes manufacturing a spacer wafer including a multitude of the spacers. Manufacturing the spacer wafer includes providing a replication tool having spacer replication sections; bringing the replication tool in contact with a first surface of another wafer; bringing a vacuum sealing chuck into contact with a second surface of the other wafer while the other wafer remains in contact with the replication tool; and injecting a liquid, viscous or plastically (Continued)

deformable material through an inlet of the vacuum sealing chuck so as to substantially fill the spacer replication sections.

17 Claims, 7 Drawing Sheets

Related U.S. Application Data

(60) Provisional application No. 61/672,544, filed on Jul. 17, 2012.

(51) Int. Cl.
*G02B 13/00* (2006.01)
*H01L 31/0203* (2014.01)
*H01L 31/0232* (2014.01)
*G02B 21/36* (2006.01)
*H01L 31/054* (2014.01)

(52) U.S. Cl.
CPC .. *H01L 27/14618* (2013.01); *H01L 27/14623* (2013.01); *H01L 27/14625* (2013.01); *H01L 27/14632* (2013.01); *H01L 27/14685* (2013.01); *H01L 31/0203* (2013.01); *H01L 31/02325* (2013.01); *H01L 31/0547* (2014.12); *H01L 2924/0002* (2013.01); *Y02E 10/52* (2013.01); *Y10T 428/24273* (2015.01); *Y10T 428/24322* (2015.01); *Y10T 428/24331* (2015.01)

(56) References Cited

U.S. PATENT DOCUMENTS

| | | |
|---|---|---|
| 8,045,159 B2 | 10/2011 | Egloff et al. |
| 2004/0023469 A1 | 2/2004 | Suda |
| 2007/0126898 A1* | 6/2007 | Feldman .................. G02B 9/12 348/294 |
| 2008/0111058 A1 | 5/2008 | Feldman et al. |
| 2008/0230934 A1* | 9/2008 | Rudmann ................ H01L 25/50 264/2.7 |
| 2008/0251707 A1* | 10/2008 | Kathman ............. G02B 6/4204 250/239 |
| 2009/0159200 A1 | 6/2009 | Rossi et al. |
| 2010/0321564 A1* | 12/2010 | Feldman .................. G02B 9/12 348/374 |
| 2011/0149143 A1 | 6/2011 | Tsujino |
| 2011/0299160 A1* | 12/2011 | Lundvall ............... G02B 3/0056 359/478 |
| 2015/0234151 A1* | 8/2015 | Venkataraman ... G02B 13/0015 348/360 |

FOREIGN PATENT DOCUMENTS

| | | |
|---|---|---|
| TW | 201037825 | 10/2010 |
| WO | 2009/151903 | 12/2009 |
| WO | 2010/091053 | 8/2010 |
| WO | 2011/049635 | 4/2011 |

* cited by examiner

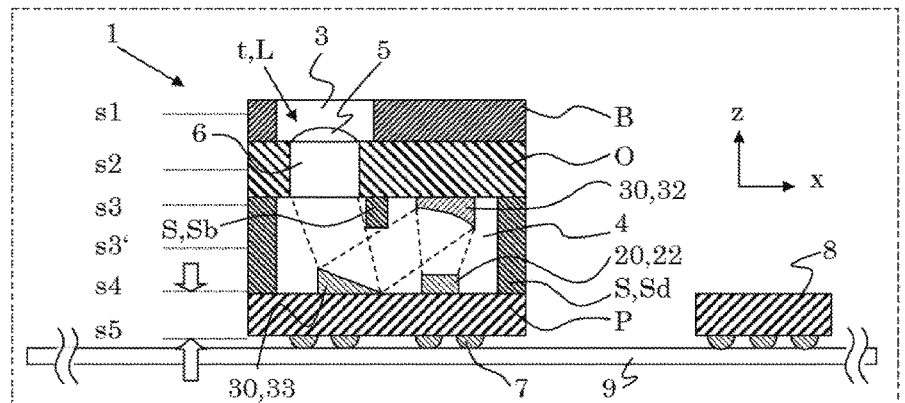
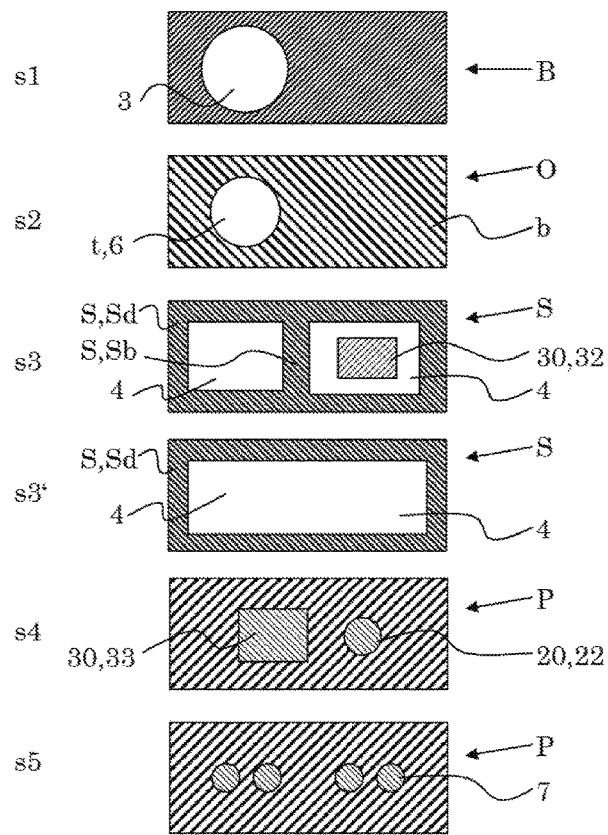
Fig. 1
Fig. 2

OPTICAL DEVICES, IN PARTICULAR COMPUTATIONAL CAMERAS, AND METHODS FOR MANUFACTURING THE SAME

CROSS-REFERENCE TO RELATED APPLICATION(S)

This application is a continuation of U.S. application Ser. No. 14/413,866, filed on Jan. 9, 2015, which is the National Stage of International Application No. PCT/EP2013/000766, filed on Mar. 14, 2013, which claims the benefit of priority U.S. Application No. 61/672,544, filed on Jul. 17, 2012.

TECHNICAL FIELD

The invention relates to the field of optics and more specifically to the packaging and manufacturing of optical or opto-electronic components. More particularly, it relates to optical modules and to methods of manufacturing the same and to appliances and devices comprising such modules. More specifically, the invention relates to computational cameras and methods of manufacturing the same. The invention relates to methods and devices according to the opening clauses of the claims.

Definition of Terms

"Active optical component": A light sensing or a light emitting component. E.g., a photodiode, an image sensor, an LED, an OLED, a laser chip. An active optical component can be present as a bare die or in a package, i.e. as a packaged component.

"Passive optical component": An optical component redirecting light by refraction and/or diffraction and/or (internal and/or external) reflection such as a lens, a prism, a mirror, or an optical system, wherein an optical system is a collection of such optical components possibly also comprising mechanical elements such as aperture stops, image screens, holders.

"Opto-electronic module": A component in which at least one active and at least one passive optical component is comprised.

"Replication": A technique by means of which a given structure or a negative thereof is reproduced. E.g., etching, embossing, imprinting, casting, molding.

"Wafer": A substantially disk- or plate-like shaped item, its extension in one direction (z-direction or vertical direction) is small with respect to its extension in the other two directions (x- and y-directions or lateral directions). Usually, on a (non-blank) wafer, a plurality of like structures or items are arranged or provided therein, typically on a rectangular grid. A wafer may have openings or holes, and a wafer may even be free of material in a predominant portion of its lateral area. A wafer may have any lateral shape, wherein round shapes and rectangular shapes are very common. Although in many contexts, a wafer is understood to be prevailingly made of a semiconductor material, in the present patent application, this is explicitely not a limitation. Accordingly, a wafer may prevailingly be made of, e.g., a semiconductor material, a polymer material, a composite material comprising metals and polymers or polymers and glass materials. In particular, hardenable materials such as thermally or UV-curable polymers are interesting wafer materials in conjunction with the presented invention.

"Lateral": cf. "Wafer"
"Vertical": cf. "Wafer"
"Light": Most generally electromagnetic radiation; more particularly electromagnetic radiation of the infrared, visible or ultraviolet portion of the electromagnetic spectrum.

BACKGROUND OF THE INVENTION

Multi-aperture cameras or computational cameras are gaining importance these days. In such cameras, several multi-pixel images, one per each "channel" of the camera, are taken—usually practically simultaneously—of at least practically the same scene and then, using some kind of algorithm, used for forming a final image of said scene. E.g., functions such as focusing that previously had to be carried out mechanically can be carried out by suitable software in accordance with said concept. One way to accomplish this has become known as the so-called 'plenoptic camera' that uses data on the direction from which radiation impinges for calculating 3D information of an image taken. There is also software available that can calculate a high resolution image from a plurality of low resolution images taken from a same viewpoint at the same time. An example of an according teaching can be found in EP 1 357 514 and the references cited therein. A further example of an according teaching that relates to a camera array is disclosed in WO 2009/151903. From US 2004/0023469 A1, a semiconductor device and its manufacturing method are known. Therein, light shielding members are formed on a semiconductor chip.

It is also possible to create a color image from multi-pixel images each taken with light of different colors. Or, the multi-pixel images could be taken at different sensivities so as to accomplish an increased dynamic range of the final image.

It can be a demand to miniaturize such cameras. And it can be advantageous to keep light from being detected in one of said channels which does not belong into that channel and more particularly to minimize cross-talk, i.e. to minimize the spilling over of light from one of the channels into another one of the channels.

SUMMARY OF THE INVENTION

One object of the invention is to create an optical device which provides a particularly good optical quality and/or which is particularly small. In addition, a way of manufacturing such optical devices shall be provided as well as corresponding wafers and wafer stacks. Furthermore, a use of particular wafers shall be provided. Said optical devices can in particular be multi-aperture cameras or modules therefor or opto-electronic modules.

Another object of the invention is to provide a miniaturized optical device.

Another object of the invention is to provide a way of efficiently manufacturing optical devices, in particular on wafer level.

Another object of the invention is to provide a particularly small computational camera or multi-aperture camera having good optical quality.

Another object of the invention is to provide optical modules in which stray light is largely suppressed.

Further objects emerge from the description and embodiments below.

At least one of these objects is at least partially achieved by apparatuses and methods according to the patent claims.

The wafer, referred to as spacer wafer, comprises a multitude of portions referred to as spacer portions, each of said spacer portions being located in a different one of a multitude of laterally defined regions. Each of said spacer portions comprises one or more portions referred to as distancing portions in which the spacer wafer has a vertical extension referred to as maximum vertical extension;

at least two separate portions referred to as open portions in which no material of the spacer wafer is present; and one or more portions referred to as structured portions in which material of the spacer wafer is present and in which the spacer wafer has a vertical extension smaller than said maximum vertical extension.

Spacer wafers commonly known from prior art usually have only what is referred to above as distancing portions and what is referred to above as open portions. The provision of the above-mentioned structured portions, however, may make possible new spacer designs. In particular, this may allow to make possible more compact designs and designs in which these structured portions act as light shields effecting an increased optical performance of optical devices, e.g., by suppressing undesired stray light and/or cross-talk within an optical device. These effects will become clearer from explanations below.

It can and often will be provided that each of said one or more distancing portions is contiguous. It can and often will be provided that each of said one or more structured portions is contiguous. It can and often will be provided that each of said one or more open portions is contiguous.

It can and often will be provided that each of said distancing portions and each of said structured portions and each of said open portions is located in a different laterally defined region, in particular wherein these different laterally defined regions are not overlapping.

It can, in particular, be provided that in each of said spacer portions, laterally defined regions defined by the respective one or more distancing portions, by the respective at least two open portions and by the respective one or more structured portions complement to the laterally defined region defined by the respective spacer portion.

In one embodiment, each of said spacer portions comprises at least three of said open portions, more particularly at least four of said open portions.

In one embodiment which may be combined with the before-addressed embodiment, each of said open portions is laterally at least partially encompassed at least one of said distancing portions. More particularly, it can be provided that each of said open portions is located laterally within at least one of said distancing portions.

This is usually meant to apply to the respective open portions and distancing portions in any of said spacer portions.

In one embodiment which may be combined with one or more of the before-addressed embodiments, each of said open portions is laterally at least partially encompassed at least one of said structured portions. More particularly, it can be provided that each of said open portions is laterally enclosed by one or more of said structured portions, or by one or more of said structured portions and at least one of said distancing portions.

This is usually meant to apply to the respective open portions, distancing portions and structured portions in any of said spacer portions.

In one embodiment which may be combined with one or more of the before-addressed embodiments, the spacer wafer is at least substantially a unitary part, wherein the spacer wafer may possibly be fully or partially provided with a coating. If no coating is provided, manufacturing steps may be saved. Manufacturing a spacer wafer as a unitary part may save manufacturing steps.

In one embodiment which may be combined with one or more of the before-addressed embodiments, the spacer wafer is substantially non-transparent, except in the open portions. This way, the spacer wafer can be suitable for suppressing undesired propagation of light. Coatings for making the spacer wafer non-transparent may become superfluous this way.

In one embodiment which may be combined with one or more of the before-addressed embodiments, the spacer wafer is substantially made of one single material, wherein this material may be a composite material, in particular, it may be a homogeneous composite material. A polymer material may be particularly suitable for the spacer wafer.

In one embodiment which may be combined with one or more of the before-addressed embodiments, the spacer wafer is substantially made of a non-transparent material. This can simplify the manufacture of the spacer wafer and make the spacer wafer suitable for specific applications in which light propagation shall be inhibited by means of the spacer wafer.

In one embodiment which may be combined with one or more of the before-addressed embodiments, the spacer wafer is at least one of made of a hardened hardenable material and obtained using a replication process. Said hardenable material can in particular be a resin and/or a curable material, more particularly a curable epoxy resin. Such materials and/or the use of replication processes may allow to manufacture spacer wafers of high quality in mass production.

In one embodiment which may be combined with one or more of the before-addressed embodiments, material of the spacer wafer describes, at one vertical end, a lateral plane, said one or more structured portions extending from said vertical end of the spacer wafer. If material of the spacer wafer describing said lateral plane is comprised in said one or more structured portions and in said one or more distancing portions, a manufacture of such a spacer wafer may be rather simple The use is a use of a wafer as described above in a manufacturing process for manufacturing an optical device. In particular, said optical device is a camera or a module for a camera, more particularly wherein said camera is a multi-aperture and/or a computational camera.

The wafer stack comprises a
wafer (spacer wafer) as described above;
a wafer referred to as optics wafer; and
a wafer referred to as substrate wafer;
wherein said spacer wafer is arranged between said optics wafer and said substrate wafer. And said wafer stack comprises a multitude of portions referred to as device portions, each of said device portions being located in one of a multitude of laterally defined regions and comprising one, in particular exactly one, of said multitude of spacer portions. Said laterally defined portions are usually not overlapping, and they are usually arranged on an array, more particularly on a rectangular lattice.

It is to be noted that it is possible that the spacer wafer is manufactured on (and onto) the optics wafer or on (and onto) the substrate wafer. In such a case, the optics wafer and the substrate wafer, respectively, is provided, and then, the spacer wafer is manufactured such that it is in direct contact with the optics wafer and substrate wafer, respectively. More details on such a way of manufacturing are described further below.

Said wafers are usually stacked upon each other along a direction referred to as vertical direction.

In one embodiment of the wafer stack, each of said device portions comprises at least two passive optical components comprised in said optics wafer. Usually, it will be provided that each of said passive optical components is associated with and allocated with one of said open portions. Said passive optical components. In a possibly more general view, optical structures replace said passive optical components.

In one embodiment which may be combined with the before-addressed embodiment, each of said at least two passive optical components is at least one of a diffractive passive optical component and a refractive passive optical component. The at least two passive optical components can in particular be or comprise lenses or lens elements.

In one embodiment referring to one or both of the two last-addressed embodiments, said at least two passive optical components do not form a unitary part.

In one embodiment which may be combined with one or more of the three last-addressed embodiments, said at least two passive optical components are distanced from each other, in particular laterally distanced from each other.

In one embodiment which may be combined with one or more of the before-addressed wafer stack embodiments with said at least two passive optical components, in each of said multitude of device portions, each of said at least two passive optical components is at least one of made of a hardened hardenable material and obtained using a replication process. Said hardenable material can in particular be a resin and/or a curable material, more particularly a curable epoxy resin. Such materials and/or the use of replication processes may allow to manufacture spacer wafers of high quality in mass production.

In one embodiment which may be combined with one or more of the before-addressed wafer stack embodiments with said at least two passive optical components, at least one of the passive optical components is comprised in an optical structure comprising said passive optical component as a main portion, e.g., basically forming a lens, and a surrounding portion at least partially surrounding said main portion. During manufacture of the optical structures, said main portion and said surrounding portion will usually be formed in one and the same replication process, e.g., in an embossing process. In typical applications, only light passing the main portion (passive optical component) is desired light, whereas light having passed the surrounding portion is undesired light (usually to be suppressed).

In one embodiment which may be combined with one or more of the before-addressed wafer stack embodiments with said at least two passive optical components, in each of said multitude of device portions, at least two of said at least two passive optical components extend into a respective one of the at least two open portions comprised in the respective device portion. It can in particular be provided that said passive optical components of any of said device portions are encased by one or more of said distancing portions comprised in the respective device portion, a portion of said optics wafer comprised in the respective device portion and a portion of said substrate wafer comprised in the respective device portion.

In one embodiment which may be combined with one or more of the before-addressed wafer stack embodiments with said at least two passive optical components, in each of said device portions, each of said at least two passive optical components extends vertically along a range referred to as vertical lens range, and in said wafer stack, at least one of said structured portions extends into said vertical lens range.

If structured portions are present between passive optical components, this can make possible to very efficiently prevent light from propagating along undesired paths.

In one embodiment which may be combined with one or more of the before-addressed wafer stack embodiments, said optics wafer comprises a multitude of blocking portions in which the optics wafer is non-transparent, and a multitude of transparent portions. If the optics wafer comprises passive optical components, these may in particular be comprised in said transparent portions.

In one embodiment which may be combined with one or more of the before-addressed wafer stack embodiments, each of said device portions comprises at least two active optical components comprised in said substrate wafer. This may allow the manufacture of opto-electronic modules and in particularly of multi-channel opto-electronic modules, which, e.g., may be multi-channel optical sensors or multi-aperture cameras or modules for the same.

In this case, it will usually be provided that each of said active optical components is associated with and allocated with one of the open portions comprised in the respective device portion. And, if present, each of said active optical components is associated with and allocated with one of said at least two passive optical components. In particular, each active optical component is a light detector for detecting light having passed an associated passive optical component.

In one embodiment referring to the last-addressed embodiment, each of said at least two active optical components comprises at least one image sensor. The provision of two-dimensional pixel arrays or multi-pixel light detectors can in particular be suitable for manufacturing multi-aperture cameras.

In one embodiment which may be combined with one or more of the before-addressed wafer stack embodiments, said substrate wafer comprises a multitude of control units each comprised in one of said multitude of device portions and operationally connected to each active optical components comprised in the respective device portion. This may, e.g., allow to compute a full image from a plurality of partial images (or sub-images) each taken by one of said active optical components.

In one embodiment which may be combined with one or more of the before-addressed wafer stack embodiments with active optical components, said wafer stack comprises, in each of said device portions, a multi-aperture or computational camera or a module for a such a camera. Such a camera may in general be a photographic camera and/or a video camera.

The optical device comprises a first member and a second member and, arranged between said first and second members, a third member referred to as spacer. Said spacer comprises one or more portions referred to as distancing portions in which the spacer has a vertical extension referred to as maximum vertical extension;

at least two separate portions referred to as open portions in which no material of the spacer is present; and one or more portions referred to as structured portions in which material of the spacer is present and in which the spacer has a vertical extension smaller than said maximum vertical extension.

Generally, properties of the spacer wafer described above readily transfer to the spacer described here, and vice versa. It is noted that the described optical device may be obtainable from a wafer stack described above, e.g., by a separation step such as dicing, e.g., laser cutting or sawing. It is, however, also possible that the optical devices are more comprehensive. The optical device may be of particularly small dimensions and have particularly good optical properties.

Usually, said first, second and third members are fixed with respect to each other. In particular, said spacer may be bonded (at one vertical end) to said first member and bonded (at an opposite vertical end) to said second member, e.g., using a curable resin. It is possible to provide that such a bonding is accomplished by means of a bonding material, e.g., by means of an adhesive. However, it is also possible that such a bonding is accomplished during manufacture of the spacer, such as by replicating, in particular molding, a spacer wafer onto an optics wafer. Such a method will be described further below.

In one embodiment of the optical device, each of said open portions is located laterally within at least one of said distancing portions.

Note that lateral directions are defined by being perpendicular to a directions along which said first, second and third members are arranged one after another, referred to as vertical direction; and such a vertical direction is also a stacking direction for the first, second and third members in the optical device.

In one embodiment which may be combined with one or more of the before-addressed optical device embodiments, outer bounds of a vertical silhouette of said first, second and third members each describe substantially one and the same substantially rectangular shape. Manufacturability of such optical devices can be particularly good.

In one embodiment which may be combined with one or more of the before-addressed optical device embodiments, said first, second and third members are of generally block- or plate-like shape, possibly comprising at least one opening. Said spacer (third member), comprises at least two such openings, namely said at least two open portions.

In one embodiment which may be combined with one or more of the before-addressed optical device embodiments, said optical device comprises an array of N times M channels, N≥2, M≥2, wherein each channel comprises one of said open portions and, allocated and associated therewith, one active optical component (such as a multi-pixel light detector) and, also allocated and associated therewith, at least one passive optical component, in particular at least one lens or lens element.

In one embodiment which may be combined with one or more of the before-addressed optical device embodiments, the optical device comprises, in addition, a printed circuit board and/or an electronic circuit.

In one embodiment which may be combined with one or more of the before-addressed optical device embodiments, the optical device is at least one of
- a communication device, more particularly a handheld communication device;
- a photographic device, more particularly a photo camera or a video camera;
- a music playing device, more particularly a handheld music playing device;
- a computing device, more particularly a mobile computing device, e.g., a tablet computer or a laptop computer;
- an optical sensor, in particular a multichannel optical sensing apparatus.

In one embodiment which may be combined with one or more of the before-addressed optical device embodiments, the optical device is or comprises a computational camera or a module for a computational camera.

The method for manufacturing one or more optical devices, each comprising a first member and a second member and, arranged between said first and second members, a third member referred to as spacer, comprises the step of a) providing said spacer;
said spacer comprising
   one or more portions referred to as distancing portions in which the spacer has a vertical extension referred to as maximum vertical extension;
   at least two separate portions referred to as open portions in which no material of the spacer is present; and
   one or more portions referred to as structured portions in which material of the spacer is present and in which the spacer has a vertical extension smaller than said maximum vertical extension.

In one embodiment, the method comprises the step of
a1) producing said spacer using a replication step, in particular an embossing step or a molding step.

Such a method may be very suitable for mass production.

In one embodiment of the method which may be combined with the before-mentioned embodiment, the method comprises the step of
b) providing a wafer referred to as spacer wafer.

Said spacer wafer comprises a multitude of said spacers, in particular wherein said spacers comprised in said spacer wafer are arranged next to each other, more particularly on a rectangular lattice.

In one embodiment referring to the last-addressed embodiment, the method comprises the steps of
c) providing a wafer referred to as optics wafer, in particular wherein said optics wafer comprises a multitude of passive optical components;
d) providing a wafer referred to as substrate wafer, in particular wherein said substrate wafer comprises a multitude of active optical components;
e) forming a wafer stack in which said spacer wafer is arranged between said optics wafer and said substrate wafer.

In particular, step e) may comprise the step of
e1) fixing said optics wafer to said substrate wafer via said spacer wafer.

More particularly, step e1) may comprise the step of
e2) applying a bonding material between said spacer wafer and said optics wafer and between said spacer wafer and said substrate wafer.

Furthermore step e2) may in particular comprise the step of
e3) hardening said bonding material using radiation, in particular UV radiation.

In one embodiment referring to last-addressed method embodiment, said optics wafer comprises a multitude of passive optical components, and said method comprises the step of
c1) manufacturing said multitude of optical elements using a replication process, in particular embossing.

In another embodiment of the method which may be combined with one or more of the described methods comprising step e1), said spacer wafer is fixed to said optics wafer or to said substrate wafer in a replication step in which said spacer wafer is manufactured. The fixing to the other wafer (optics wafer or substrate wafer) may alternatively be accomplished like cited in step e2), i.e. by applying a bonding material between the adjacent wafers. However, that fixing may also be accomplished by replicating the spacer wafer against the other wafer.

In one embodiment which may be combined with one or more of the before-addressed method embodiments comprising step b), the method comprises the step of b') manufacturing said spacer wafer;

wherein step b') comprises the steps of b1) providing a replication tool having spacer replication sections;

b2) providing another wafer;

b3) bringing said replication tool in contact with a first surface of said other wafer;

b4) bringing a vacuum sealing chuck into contact with a second surface of said other wafer while said other wafer remains in contact with said replication tool;

b5) injecting a liquid, viscous or plastically deformable material through an inlet of said vacuum sealing chuck so as to substantially fill said spacer replication sections.

This can be an elegant way of manufacturing a spacer wafer onto another wafer such as onto the optics wafer or onto the substrate wafer.

Said first and second surfaces are usually vertical surfaces, i.e. the usually by far largest surfaces of the wafer. And also usually, said second surface is arranged opposite said first surface (and parallel thereto).

The vacuum sealing chuck may in addition be in contact with the replication tool, in particular during step b5).

The spacer replication sections describe a negative of the shape of the spacer wafer to be manufactured (or a portion thereof). In such a method, a space between the replication tool and said other wafer is defined which has the shape of the spacer wafer to be manufactured. After carrying out step b5), the injected material forms a body having the shape of the spacer wafer to be manufactured or a body comprises that shape.

Usually, after step b5), the step of b6) hardening the injected liquid, viscous or plastically deformable material; is carried out Said hardening may be accomplished by applying, e.g., heat and/or UV radiation.

And after step b6), usually the step of b7) releasing said other wafer, having the hardened injected liquid, viscous or plastically deformable material thereon from the replication tool and the vacuum sealing chuck.

Thus, a replicated spacer wafer is produced in said other wafer. No additional step is usually required for fixing the replicated wafer to said other wafer. The two so-obtained wafers may form one contiguous part.

Further details concerning method steps of such a method for replication with a vacuum sealing chuck and of apparatuses for carrying out such a method can be found in the US provisional application with application No. 61/746,347 filed on Dec. 27, 2012 with the USPTO. Therefore, this US provisional application with application No. 61/746,347 is herewith incorporated by reference in the present patent application.

In an even more refined method, one and the same replication tool (which may be similar to the one of the last-mentioned embodiment) is used for manufacturing passive optical components (such as lens elements) on the optics wafer and for manufacturing the spacer wafer:

In one embodiment which may be combined with one or more of the before-addressed method embodiments except with the last-mentioned embodiment (with steps b') and b1) to b5)), the method comprises the step of g1) providing a replication tool having optical element replication sections and spacer replication sections;

g2) providing a first liquid, viscous or plastically deformable material onto the optical element replication sections of the replication tool;

g3) bringing a wafer referred to as base wafer into contact with the replication tool so that the first liquid, viscous or plastically deformable material is pressed between a first surface of the base wafer and the optical replication sections;

g4) hardening the first liquid, viscous or plastically deformable material to form replicated optical elements on the first surface of the base wafer;

g5) bringing a vacuum sealing chuck into contact with a second side of the base wafer while the base wafer remains in contact with the replication tool;

g6) injecting a second liquid, viscous or plastically deformable material through an inlet of said vacuum sealing chuck so as to substantially fill said spacer replication sections;

g7) hardening the second liquid, viscous or plastically deformable material.

This can be an elegant way of manufacturing, using one and the same replication tool, passive optical components on a base wafer (which usually will become the optics wafer); and the spacer wafer onto the base wafer (which usually will become the optics wafer).

Said first and second surfaces are usually vertical surfaces, i.e. the usually by far largest surfaces of the base wafer. And also usually, said second surface is arranged opposite said first surface (and parallel thereto).

The vacuum sealing chuck may in addition be in contact with the replication tool.

The spacer replication sections describe approximately a negative of the shape of the spacer wafer to be manufactured (or of a portion thereof). In such a method, a space between the replication tool and said other wafer is defined which has approximately the shape of the spacer wafer to be manufactured. After carrying out step g7), the injected second material forms the spacer wafer.

Said hardening (cf. steps g4), g7)) may be accomplished by applying, e.g., heat and/or UV radiation.

The base wafer may be just a flat, though usually transparent or at least partially transparent wafer (cf. transparent portions and blocking portions elsewhere in the present description), e.g., it may be a wafer referred to as precursor wafer elsewhere in the present description (cf. below), or it may be, e.g., a glass wafer (cf. below).

While the steps g6), g7) describe a molding or molding-like process, steps g2), g3), g4) describe an embossing or embossing-like process. In the latter process, optical elements such as the passive optical components of the optics wafer are replicated on the base wafer.

It is to be noted that the first and second liquid, viscous or plastically deformable materials may be identical materials, but they may also be different materials. The latter can be of interest in particular where the first material is a transparent material and the second material is a non-transparent material, a light-blocking material).

In step g6), the space to be taken by the spacer wafer is filled with the second liquid, viscous or plastically deformable material.

In step g7), the spacer wafer is formed on the first surface of the base wafer (which at that time may, in some embodiments, already be identified with the optics wafer).

Further details concerning method steps of such a method for replication of optical structures (or passive optical components) and spacer structures or a spacer wafer using a single replication tool and of apparatuses for carrying out such a method can be found in the US provisional application with application No. 61/746,347 filed on Dec. 27, 2012 with the USPTO. Also for this reason, this US provisional application with application No. 61/746,347 is herewith incorporated by reference in the present patent application.

One step in the manufacture of the one or more optical devices, in any of the described methods, usually is the step of f) separating said wafer stack into a multitude of said optical devices.

The invention comprises optical device with features of corresponding methods according to the invention, and, vice versa, also methods with features of corresponding optical devices according to the invention.

The advantages of the optical devices basically correspond to the advantages of corresponding methods, and, vice versa, the advantages of the methods basically correspond to the advantages of corresponding optical devices.

The invention also comprises wafers and/or wafer stacks with features of corresponding methods according to the invention, and, vice versa, also methods with features of corresponding wafers and/or wafer stacks according to the invention.

The advantages of the wafers and/or wafer stacks basically correspond to the advantages of corresponding methods, and, vice versa, the advantages of the methods basically correspond to the advantages of corresponding wafers and/or wafer stacks.

Further embodiments and advantages emerge from the dependent claims and the figures.

BRIEF DESCRIPTION OF THE DRAWINGS

Below, the invention is described in more detail by means of examples and the included drawings. The figures show in a schematized manner:

FIG. 1 a cross-sectional view of a device comprising an optical module;

FIG. 2 various cross-sectional views of constituents of the optical module of FIG. 1;

Figure 3:
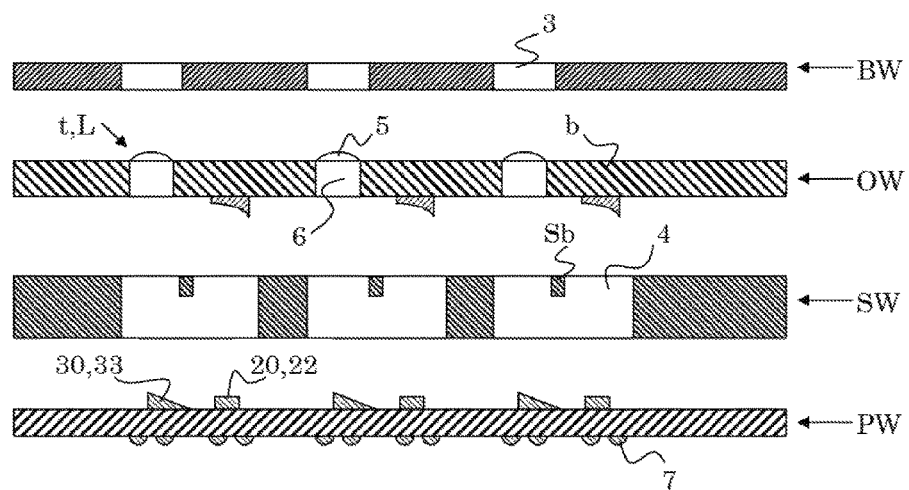
FIG. 3 a cross-sectional view of wafers for forming a wafer stack for manufacturing a multitude of optical modules of FIG. 1.

The described embodiments are meant as examples and shall not confine the invention.

DETAILED DESCRIPTION OF THE INVENTION

FIG. 1 shows a schematic cross-sectional view of a device 10 comprising an optical module 1, wherein the optical module in particular is an opto-electronic module 1. Optical modules 1 can also be considered optical devices. The illustrated cross-section is a vertical cross-section. FIG. 2 shows various lateral schematic cross-sectional views of constituents of the module of FIG. 1, wherein the approximate positions of these lateral cross-sections are indicated in FIG. 1 by s1 to s5 and dotted lines. For s4 and s5, the direction of view is indicated by open arrows.

Device 10 can be, e.g., an electronic device and/or a photographic device. It comprises, besides module 1, a printed circuit board 9 on which module 1 is mounted. In addition mounted on printed circuit board 9 is an electronic component, e.g., an integrated circuit 8 such as a control unit 8 or controller chip which is operationally interconnected with module 1 by printed circuit board 9. E.g., integrated circuit 8 may evaluate signals outputted by module 1 and/or provide signals to module 1 for controlling the same.

Module 1 comprises several constituents (P, S, O, B) stacked upon each other in a direction through which the term "vertical" is defined; it corresponds to the z direction (cf. FIG. 1). Directions in the x-y plane (cf. FIG. 2) perpendicular to the vertical (z) direction are referred to as "lateral".

Module 1 comprises a substrate P, a separation member S (which can also be referred to as spacer), an optics member O and an optional baffle member B stacked upon each other. Substrate P is, e.g., a printed circuit board assembly, but might be merely a printed circuit board. The printed circuit board (PCB) of this PCB assembly can more specifically also be referred to as an interposer. On the PCB, an active optical component 20 such as a light emitter 22 is mounted and a passive optical component 30, too. Passive optical component 30 can more specifically be a reflective element 33, e.g., a mirrored prism. On or at optics member O, a passive optical component 30 is arranged which more specifically is a reflective element 32, e.g., a curved mirror.

Electrical contacts of active optical component 20 are electrically connected to the outside of module 1 by and via substrate P, where solder balls 7 are attached. Instead of providing solder balls 7, it would also be possible to provide contact pads on the PCB which are not (or at a later time) provided with solder balls.

This way, module 1 can be mounted on printed circuit board 9, e.g., in surface mount technology (SMT), next to other electronic components such as controller 8. Module 1 is particularly suitable for an application in a compact electronic device 10 such as in a hand-held communication device, because it can be designed and manufactured to have a particularly small size.

Separation member S has an opening 4 in which the active and passive optical components, respectively (22, 32, 33), are arranged. This way, these items are laterally encircled by separating member S (cf. FIGS. 1 and 2). opening 4 can also be considered an open portion 4.

Separation member (spacer) S may fulfill several tasks. It can ensure a well-defined distance between substrate P and optics member O (through its vertical extension) which helps to achieve well-defined light paths within the module. Separation member S can also inhibit the propagation of light generated by active optical component 20 out of module 1 via undesired light paths. This is accomplished by separation member S forming a portion of the outside walls of module 1, separation member S being, e.g., made substantially of a non-transparent material. Typically, separating member S is made of a polymer material, in particular of a hardenable or, more specifically, curable polymer material, e.g., of an epoxy resin. If separating member S is made of a substantially non-transparent curable material, it can in particular be a heat-curable material.

Optics member O comprises a blocking portion b and a transparent portion t, the latter for allowing light emitted by active optical component 20 to leave module 1.

Blocking portion b is substantially non-transparent for light, e.g., by being made of a suitable (polymer) material, e.g., like described for separating member S. Transparent portion t comprises a passive optical component L or, more particularly and as an example, a lens member, for light guidance. Lens member L may, e.g., comprise, as shown in FIG. 1, a lens element 5 in close contact to a transparent element 6.

Transparent element 6 can have the same vertical dimension as optics member O where it forms blocking portion b, such that optics member O where it forms blocking portion b together with transparent element 6 describes a (close-to-perfect) solid plate shape. Lens element 5 redirects light by refraction (cf. FIG. 1) and/or by diffraction (not illustrated in FIG. 1). Lens element L may, e.g., be of generally convex shape (as shown in FIG. 1), but lens element 5 may be differently shaped, e.g., generally or partially concave. It is furthermore possible (not shown) to provide another optical structure on the opposite side of transparent element 6.

Baffle member B is optional and allows to shield undesired light, in particular light leaving module 1 in an desired angle. Usually, baffle member B will have a transparent region 3 which may be embodied as an opening or by means of transparent material. Baffle member B can, outside transparent region 3, be made of a material substantially attenuating or blocking light, or it could be provided with a coating having such a property, wherein the latter will usually be more complex to manufacture. The shape of baffle member B or, more precisely, of the transparent region 3, can, of course, be different from what is shown in FIGS. 1 and 2, and it may, e.g., describe a cone-like shape or a truncated pyramid.

The lateral shape not only of the transparent regions 3, but also of the transparent portions t and of the openings 4 do not have to be like drawn in FIG. 2, but may have other appearances, e.g., polygonal or rectangular with rounded corners or elliptic.

Coming back to separation member S, it does not solely comprise a laterally defined region in which separation member S extends vertically to a maximum extent (cf. spacer portion Sd), namely to the extent substantially defining the vertical distance between substrate P and optics member O, and laterally defined regions in which it is completely free of material forming an opening vertically fully traversing said maximum vertical extension (cf. opening 4). But there is a laterally defined region in which material (usually non-transparent material) of separation member S extends vertically along only a portion of said maximum vertical extension, namely in the region of spacer portion Sb. Thus, spacer portion Sb can function as a light shield for light inside module 1 (cf. FIG. 1). It can prevent a propagation of light along undesired paths. In particular, if separation member S is manufactured using replication, the extra functionality of separation member S provided by spacer portion Sb is readily achievable, at nearly no cost in terms of manufacturability and manufacturing steps. The portion of spacer S where spacer S extends vertically to a maximum extent is referred to as distancing portion Sd. The portion where spacer S is free of material and forms an opening can also be referred to as open portion. The portion of spacer S where spacer S extends vertically less than said maximum extent can also be referred to as structured portion Sb. In FIG. 2, structured portion Sb is visible in cross-section s3, but not in cross-section s3' (cf. FIG. 1 for the vertical positions of the cross-sections).

Instead of being a light-emitting module 1 comprising a light emitting member 22 as an active optical component 20, it could also be provided that active optical component 20 is a detection member for detecting light, such as an image detector or a photo diode. In this case, separation member S could also be provided for protecting the detection member from light that is not supposed to be detected by the detection member, by being substantially non-transparent and by forming a portion of the outside walls of module 1 and by forming a light shield, namely spacer portion Sb. And furthermore, transparent portion t could then be provided for allowing light to enter module 1 from the outside of module 1 and to reach the detecting member.

And, it is also possible to provide, in one module 1, a light emitting member and a detection member (not illustrated). Both would usually, for accomplishing electric contacts of these active optical components to the outside of module 1, be mounted on substrate P. Such a module could be used, e.g., for investigating the environment of module 1 by emitting light out of module 1 and detecting light having interacted with an object in the environment of module 1.

And furthermore, it is possible to provide modules which are designed according to the same principles as discussed above, but comprising, in addition to one or two active optical components, one or more additional electronic components such as additional light detectors, and/or integrated circuits, and/or light sources.

Module 1 is an opto-electronic component, more precisely a packaged opto-electronic component. The vertical side walls of module 1 are formed by items P, S, O and B. A bottom wall is formed by substrate P, and a top wall by baffle member B or by baffle member B together with optics member O, or, in case no baffle member B is provided, by optics member O alone.

As is well visible in FIG. 2, the four items P, S, O, B, which can for the reasons above also be referred to as housing components (contributing to a housing of module 1), all have substantially the same outer lateral shape and outer lateral dimensions. This is related to a possible and very efficient way of manufacturing such modules 1 which is described in more detail below referring to FIGS. 3 and 4. These housing components P, S, O, and B are all of generally block- or plate-like shape or, more generally, of generally rectangular parallelepiped shape, possibly having holes or openings (such as baffle member B and separation member S do) or (vertical) projections (such as optics member O does due to optical structure 5).

Passive optical components 32 and 33 and active optical component 22 are arranged such that light can propagate inside module 1 along an optical path interconnecting these components and transparent portion t.

Active electronic components 20 comprised in a module 1 (such as emission member 22 in the example of FIG. 1) can be packaged or unpackaged electronic components. For contacting substrate P, technologies such as wire-bonding or flip chip technology or any other known surface mount technologies may be used, or even conventional through-hole technology. Providing active optical components as bare dice or chip scale packages allows to realized particularly small designs of modules 1, yet also active optical components packaged in a different way may be comprised in a module 1.

As will explained in more detail in embodiments described further below, substrate P can also be or comprise a semiconductor material such as silicon, in particular a plate of such a material, more particularly a contiguous portion of a semiconductor wafer, having a lateral extension substantially equal to the lateral extension of the module 1.

FIG. 3 shows a schematical cross-sectional view of wafers for forming a wafer stack 2 for manufacturing a multitude of modules as shown in FIGS. 1 and 2. It is possible to manufacture such modules 1 (practically) completely on wafer-scale, of course with a subsequent separation step. Although FIGS. 3 and 4 only show provisions for three modules 1, there will usually be in one wafer stack provisions for at least 10, rather at least 30 or even more than 50 modules in each lateral direction. Typical dimensions of each of the wafers are: laterally at least 5 cm or 10 cm, and up to 30 cm or 40 cm or even 50 cm; and vertically (measured with no components arranged on substrate wafer PW) at least 0.2 mm or 0.4 mm or even 1 mm, and up to 6 mm or 10 mm or even 20 mm.

Four wafers (or, with no baffle wafer provided: three wafers) are sufficient for manufacturing a multitude of modules shown in FIG. 1: A substrate wafer PW, a spacer wafer SW, an optics wafer OW and optional baffle wafer BW. Each wafer comprises a multitude of the corresponding members comprised in the corresponding module 1 (cf. FIGS. 1 and 2), usually arranged on a rectangular lattice, typically with a little distance from each other for a wafer separation step.

Substrate wafer PW can be a PCB assembly comprising a PCB of standard PCB materials such as FR4, provided with solder balls 7 on the one side and with one or more optical elements (in FIG. 1: active optical component 22 and passive optical component 22) connected (e.g., soldered or glued) to the other side. The optical elements can be placed on substrate wafer PW, e.g., by pick-and-place using standard pick-and-place machines. Similarly, passive optical component 32 may be placed on optics wafer OW. However, it is also possible to manufacture passive optical component 32 using a replication method.

When optical elements are provided on a wafer, it is important to ensure that they are sufficiently accurately positioned with respect to each other.

In other embodiments, substrate wafer PW can be or at least comprise a semiconductor wafer such as a silicone wafer, and in particular, it may comprise a multitude of active optical components, more particularly image detectors and/or two-dimensional arrays of light-sensitive elements.

In order to provide maximum protection from undesired light propagation, all wafers PW, SW, OW, BW can substantially be made of a material substantially non-transparent for light, of course except in transparent areas such as in transparent portions t and transparent regions 3.

Wafers SW and BW and possibly also all or a portion of wafer OW may be produced by replication or at least using replication. In an exemplary replication process, a structured surface is embossed into a liquid, viscous or plastically deformable material, then the material is hardened, e.g., by curing using ultraviolet radiation or heating, and then the structured surface is removed. Thus, a replica (which in this case is an negative replica) of the structured surface is obtained. Suitable materials for replication are, e.g., hardenable (more particularly curable) polymer materials or other replication materials, i.e. materials which are transformable in a hardening step (more particularly in a curing step) from a liquid, viscous or plastically deformable state into a solid state. Replication is a known technique, cf., e.g., WO 2005/083789 A2 for more details about this.

In case of optics wafer OW, replication, e.g., embossing or molding, may be used for obtaining the non-transparent portion (blocking portion b). It would also be possible to provide holes, where transparent portions t are supposed to be, by drilling or by etching.

Subsequently, a so-obtained precursor wafer substantially comprised of blocking portion b is provided with lens members L and passive optical component 22. The former may be accomplished by means of replication, e.g., forming lens members L as a unitary parts, e.g., as described in US 2011/0043923 A1. The lens members L can, however, also be manufactured starting from a semi-finished part being a wafer comprising transparent elements 6 within holes by which transparent regions 3 are defined. This can be particularly useful when the lens members L each describe at least one apex, and those apices are located outside a vertical cross-section of the optics wafer OW. Such a semi-finished part (usually and in the exemplary case shown in the figures) is a flat disk-like wafer having no holes penetrating the wafer in the transparent regions 3 and having virtually no or only shallow surface corrugations, such surface corrugations usually being concave, i.e. not extending beyond the wafer surface as described by the blocking portions b.

A semi-finished part like that can be obtained starting from a flat precursor wafer (typically made of a single possibly composed material) having holes or openings where the transparent portions t are supposed to be and then filling the holes with transparent material, e.g., using a dispensing process, and either filling the holes in the precursor wafer one-by-one, e.g., using a dispenser such as used for underfilling processes in flip-chip technology or the like, or by filling several holes at once, e.g., using a squeegee process (e.g., as known from screen printing) or a dispenser with several hollow needles outputting material. During the dispensing, the wafer can be placed on a flat support plate, e.g., made of a silicone. Care has to be taken order to prevent the formation of air bubbles or cavities in the dispensed material, since this would degrade the optical properties of the lens members L to be produced. E.g., one can carry out the dispensing in such a way that wetting of the wafer material starts at an edge formed by the wafer and an underlying support plate (or in a place close to such an edge), e.g., by suitably guiding a hollow needle outputting the material close to such an edge. Subsequently, the dispensed material is cured, e.g., by heat or UV radiation, so as to obtain hardened transparent material.

Convex meniscuses possibly formed this way can be flattened by polishing, so as to obtain a transparent element 6 having parallel surfaces adjusted to the wafer thickness. Then, by means of replication, optical structures 5 (lens elements 5) are applied to one or both sides (top and button side) of wafer OW. In case of concave meniscuses of the transparent elements, the replication can take place on these, wherein the amount of applied replication material might have to be adjusted accordingly.

It is generally possible to provide that said spacer wafer SW and/or said baffle wafer BW are obsolete in the sense that a particular kind of optics wafer is provided which comprises one or both of these wafers, i.e. in this case, the respective wafer is or respective wafers are a portion of the optics wafer. Such an optics wafer ("combined optics wafer") incorporates the features and functionalities of said spacer wafer SW and/or of said baffle wafer BW. Producing such a "combined optics wafer" may be accomplished using a particular precursor wafer and, manufactured based thereon, a particular semi-finished part. Such a precursor wafer and semi-finished part, respectively, has at least one structured surface, usually having protrusions extending vertically beyond at least one of the two surfaces of transparent elements to be provided in the precursor wafer and present in the semi-finished part, respectively. Looking upon wafers OW and SW (or wafers OW and BW, or wafers OW and SW and BW) in FIG. 4 as one single part, it can be readily visualized what a corresponding optics wafer ("combined optics wafer") for manufacturing a module according to FIG. 1 and also a corresponding semi-finished part would look like.

In general, it is also, as a partial alternative to the above, possible to provide that spacer wafer SW is a portion of substrate wafer PW. In this case, substrate wafer PW would rather not be made of standard PCB materials, but of a replication material.

In order to form a wafer stack 2, the wafers are aligned and bonded together, e.g., by gluing, e.g., using a heat-curable epoxy resin. It is usually a critical point to ensure that each optical element on substrate wafer PW (such as active optical component 22 and passive optical component 33) is sufficiently accurately allocated with the optical elements of optics wafer OW (such as passive optical component 32) and transparent portion t.

In the above, various ways of manufacturing wafers, in particular spacer wafers SW and/or optics wafers OW and also baffle wafers BW have been described, and also ways of manufacturing passive optical components such as lens elements have been described. Further below, alternative (yet also additionally usable) manufacturing methods and steps will be described. These may even allow to dispense with applying bonding material between (certain) adjacent wafers.

Figure 4:
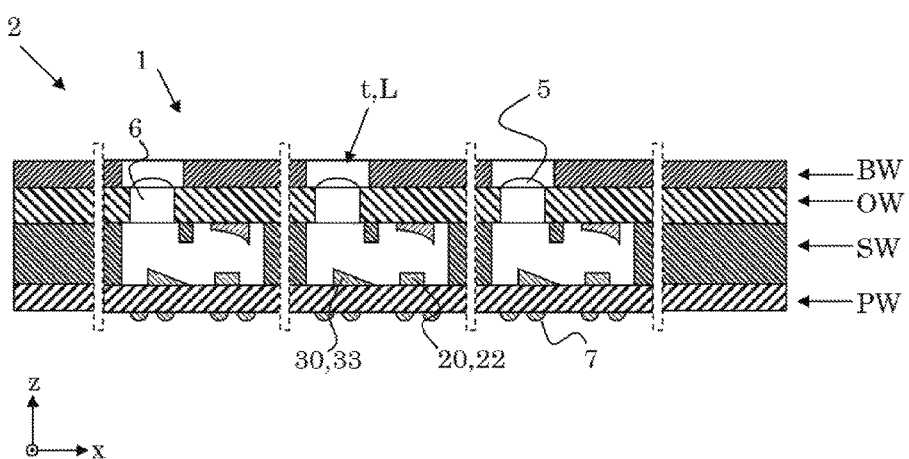
FIG. 4 a cross-sectional view of a wafer stack for manufacturing a multitude of optical modules of FIG. 1.

FIG. 4 shows a cross-sectional view of a so-obtained wafer stack 2 for manufacturing a multitude of modules 1 as shown in FIG. 1. The thin dashed rectangles indicate where separation takes place, e.g., by means of using a dicing saw or by laser cutting.

The fact that most alignment steps are carried out on wafer level makes it possible to achieve a good alignment of the optical elements in a rather simple and very fast way. Thus, a well-defined optical path can be realized for light inside module 1. The overall manufacturing process is very fast and precise. Due to the wafer-scale manufacturing, only a very small number of production steps is required for manufacturing a multitude of modules 1.

It is to be noted that by providing a spacer comprising both, distancing portions Sd and structured portions Sb, more particularly by providing distancing portions Sd and structured portions Sb as a unitary part and/or by manufacturing both, distancing portions Sd and structured portions Sb, in one and the same manufacturing process, a very precise relative (Sb vs. Sd) and absolute vertical extension (height) of these spacer portions can be achieved, in particular wherein this is achievable in mass production.

Following the before-presented ideas, various other optical modules 1 may be construed and manufactured. In the following, some examples are described.

Figure 5:
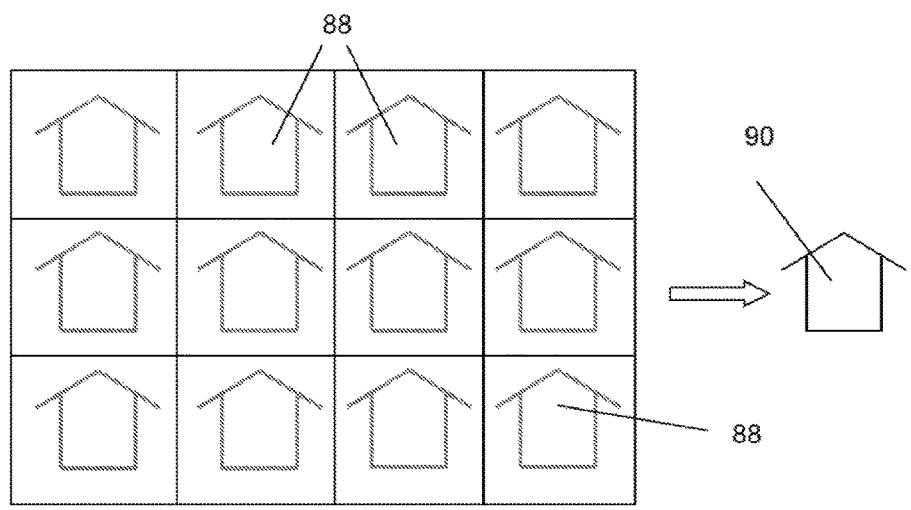
FIG. 5 a symbolic sketch visualizing a principle of a computational camera.

A particularly interesting application is multi-channel optical sensors and, more particularly, multi-aperture cameras or computational cameras. FIG. 5 is a symbolic sketch visualizing a principle of a such a camera. In a computational camera, several (partial) images 88 are taken, usually at least approximately simultaneously, and then, a (final) image 90 is computed from these, wherein for the computing, usually, a particular algorithm is applied. In other words, data representative of the final image 90 are derived in dependence of at least two data sets representative of a partial image 88 each. In many cases, in each partial image 88 at least approximately the same (full) scene is imaged as is in the final image 90. In most computational cameras, several image sensors (multipixel sensors, multi-pixel light detectors) are provided (usually one for each partial image 88) which are arranged on an array, e.g., like symbolized in FIG. 5, where a three times four array is illustrated. One can assign a number of channels to a multi-aperture or computational camera, which is given by the number of partial images 88 taken for obtaining one final image 90. In the example of FIG. 5, the case of a 12-channel camera is illustrated.

Various types of computational cameras are known or can be thought of. E.g., plenoptic cameras; cameras where multi-pixel images are taken with light of different colors and then composed to yield a (full) color image; cameras where multi-pixel images are taken at different sensivities so as to accomplish an increased dynamic range of the final image, cameras where multi-pixel images are taken at different focus setting so as to accomplish, e.g., a final image with selectable in-focus and out-of-focus areas.

It is possible to manufacture multi-aperture and computational camers or modules for these using the concepts described in the present patent application.

Figure 6:
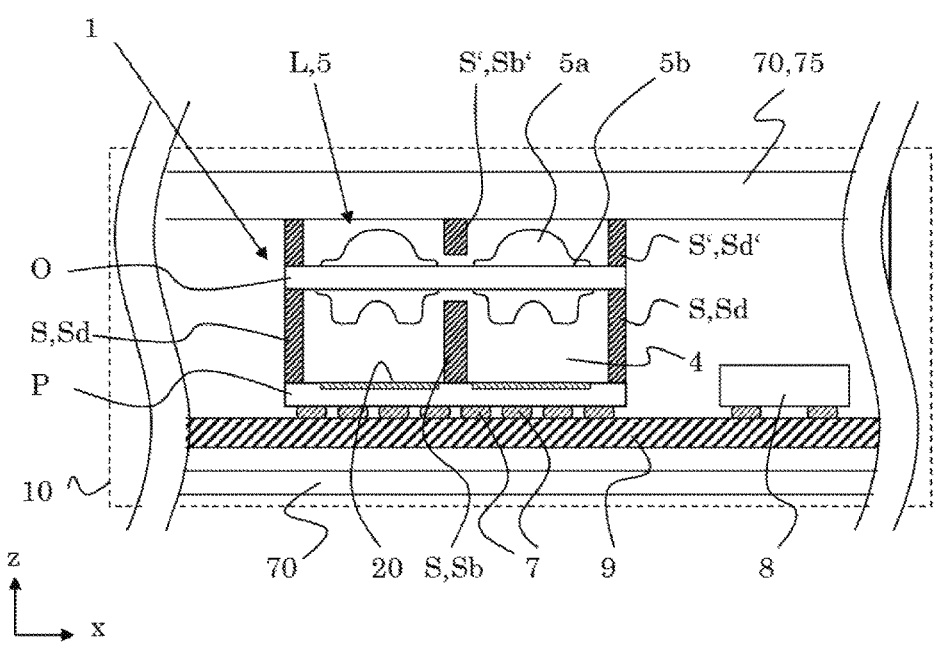
FIG. 6 a cross-sectional view of a detail of a device comprising an optical module.

FIG. 6 is a schematical illustration of a cross-section through a detail of an electronic device 10 comprising a multi-channel opto-electronic module 1. The electronic device 10 comprises a housing 70 comprising a cover glass 75 to which opto-electronic module 1 can be attached and a printed circuit board 9 on which further electronic components are provided such as electronic component 8. Opto-electronic module 1 is operationally connected to printed circuit board 9, e.g., via solder balls 7 as illustrated in FIG. 6. Separation member S (spacer S) and substrate P contribute to a housing of opto-electronic module 1, at least on five sides of opto-electronic module 1. A second spacer S' can be considered contributing to said housing, too; and spacer S' could be considered a baffle. In the cross-sectional view of FIG. 6, in one module 1, there are two channels visible. Electronic device 10 can be, e.g., computational camera, an array camera, a multi-aperture camera, a plenoptic camera, wherein in these cases, the active optical components 20 would typically be image sensors such as CMOS-based image chips, e.g., like used in today's digital photo cameras. Each channel of opto-electronic module 1 may allow to catch one sub-image (partial image), and from the plurality of sub-images caught by opto-electronic module 1, a final image can be obtained, usually by means of processing, e.g., image processing using one or more suitable algorithms. A final image may be obtainable within electronic device 10, e.g., making use of electronic component 8, and/or a final image can be obtained in an external device into which data descriptive of said sub-images have been loaded, e.g., a computer with a suitable software. It is also possible to provide that (image) processing is accomplished within module 1. E.g., the processing may be accomplished (in full or in part) in substrate S, e.g., in places between the active optical components 20. Substrate P would in this case at least substantially be a portion of a semiconductor wafer in which image sensors and image processing circuitry would be realized.

Electronic device 10 could also be, e.g., a multi-channel optical sensor in which active optical components 20 could, e.g., be photo diodes.

Also, an opto-electronic module 1 alone can already be considered to embody a device (electronic device, optical device and/or opto-electronic device) such as a camera or an optical sensor.

At least primarily in order to prevent cross-talk between channels of the device 1, spacer portions Sb (of spacer S) and Sb' (of spacer S') are provided. The illustrated particular optical structures 5 form passive optical components, The optical structures 5 have a main portion 5a which basically is a lens, and a surrounding portion 5b at least partially surrounding said main portion 5a. During manufacture of the optical structures, main portion 5a and surrounding portion 5b are formed in one and the same replication process, typically in an embossing process. Light to be detected passes the main portion 5a prior to being used, in particular prior to being detected. It is not desired that light having passed the surrounding portion is used and detected, respectively.

In order to be able to manufacture a particularly small optical module 1, lateral distances between neighboring active optical components 20 should be small, and lateral distances between neighboring passive optical components (e.g., lenses) should be small. The first does, in practice, not mean a technical obstacle, but since space in a semiconductor wafer is expensive, there are economic reasons why such distances should be as small as possible. The latter, however is limited by the provision of a spacer portion between the neighboring lenses for light shielding. If, like known in the art, spacer portions extend over the maximum vertical extension, this may require a larger distance between neighboring lenses than actually achievable when no spacer portion needs to be provided between the neighboring lenses. In other words, the provision of structured portions Sb, Sb' (which do not have the maximum vertical extension) may allow to design the distance from channel to channel and thus the overall (lateral) size of the module 1 very small and very economically. Since light from a surrounding portion 5b should anyway not be detected (or detectable), the vertical extension of the structured portions Sb, Sb' can be such that the structured portions Sb, Sb' come vertically close to the surrounding portions 5b and laterally overlap with these. More particularly, the vertical extension of the structured portions Sb, Sb' can be such that the structured portions Sb, Sb' extend into the vertical range along which the optical structures (more particularly the main portions 5a) are extended.

From a manufacturability point of view, the module 1 illustrated in FIG. 6 is improved with respect to one lacking structured portions Sb, Sb', because it may be provided that less strict (lateral) positioning tolerances need to be met for positioning separation member S (spacer) with respect to optics member O.

Optics member O is drawn in FIG. 6 as consisting substantially of a transparent material, more particularly as a transparent plate plus optical structures. However, it is certainly also possible to provide one or more blocking portions and one or more transparent portions plus optical structures as the optics member, e.g., similar to what is shown in FIG. 1.

Figure 7:
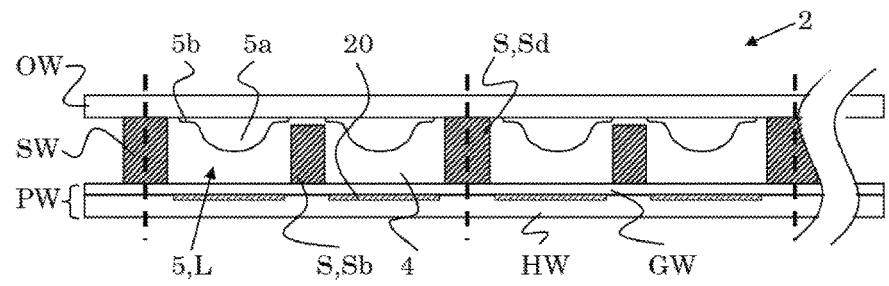
FIG. 7 a cross-sectional view of a detail of a wafer stack for manufacturing a multitude of optical modules.

FIG. 7 is a cross-sectional view of a detail of a wafer stack 2 for manufacturing a multitude of optical modules. In this case, one lens element is provided per channel. Substrate wafer SW comprises two wafers, namely a glass wafer GW and, attached thereto, a semiconductor wafer HW. Glass wafer GW protects active optical components of substrate wafer SW against detrimental influences and may generally be made of any transparent material, e.g., of a transparent polymer.

Like in the example of FIG. 6, two channels are visible in the illustrated cross-section. Distancing portions Sd ensure with high precision a well-defined distance between wafers PW and OW. Structured portions Sb suppress cross-talk between the channels, while, due to their limited vertical extension, not leading to an increase in the distance between neighboring channels.

Here as well in the following two Figures, the thick dashed lines indicate where separation takes place for obtaining separate optical devices.

Figure 8:
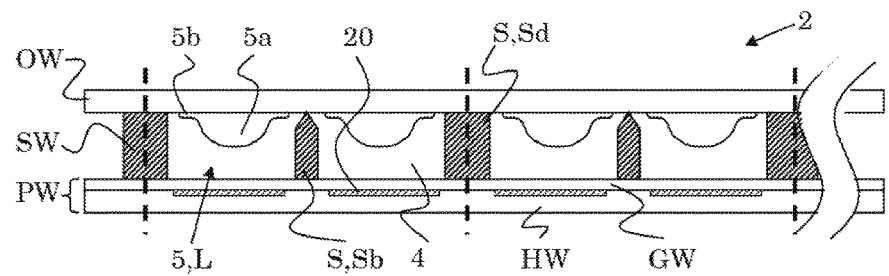
FIG. 8 a cross-sectional view of a detail of a wafer stack for manufacturing a multitude of optical modules.

FIG. 8 is a cross-sectional view of a detail of a of another wafer stack 2 for manufacturing a multitude of optical modules. This embodiment is largely identical with the one of FIG. 7, but the structured spacer portions Sb are, in the illustrated vertical cross-section, tapered towards wafer OW. This may, as in the illustrated example of FIG. 8, lead to even less cross-talk while not causing any increase in distance between the channels.

Figure 9:
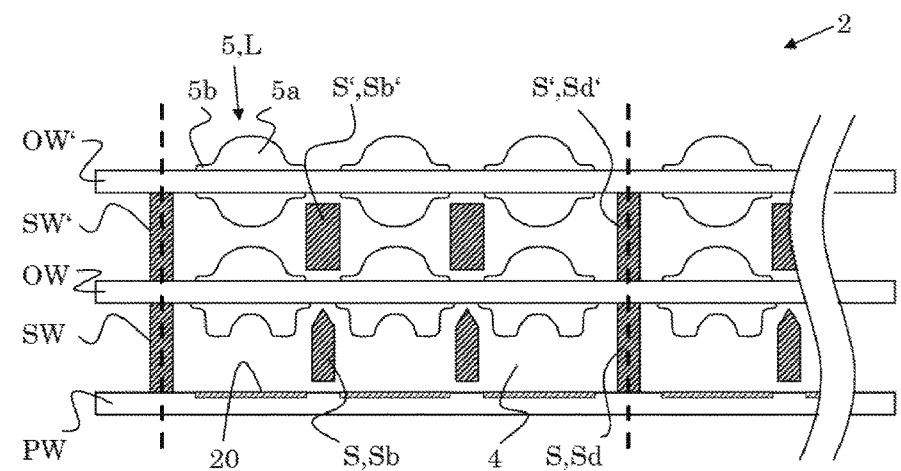
FIG. 9 a cross-sectional view of a detail of a wafer stack for manufacturing a multitude of optical modules.

FIG. 9 is a cross-sectional view of a detail of yet another wafer stack 2 for manufacturing a multitude of optical modules. In this case, a second optics wafer OW' is provided as well as a second spacer wafer SW', the latter ensuring a well-defined distance between the optics wafers OW and OW'. This embodiment also illustrates a three times M (M: integer, usually at least 2) array of channels in each device. And it further illustrates that structured spacer portions Sb, Sb' may be provided which are spaced apart from both wafers between which the mutual distance is defined by a distancing portion of the respective spacer wafer, such as in case of wafers PW and OW for portions Sb and Sd, and as in case of wafers OW and OW' for portions Sb' and Sd'. Having the structured portions (Sb,Sb') spaced apart from a semiconductor wafer (which is not protected by another wafer like, e.g., in the cases illustrated in FIGS. 7 and 8) can be advantageous with respect to avoiding influencing or damaging the semiconductor wafer and, more particularly, active optical components present thereon, such as multi-pixel photo detectors like in FIG. 9.

Figure 10:
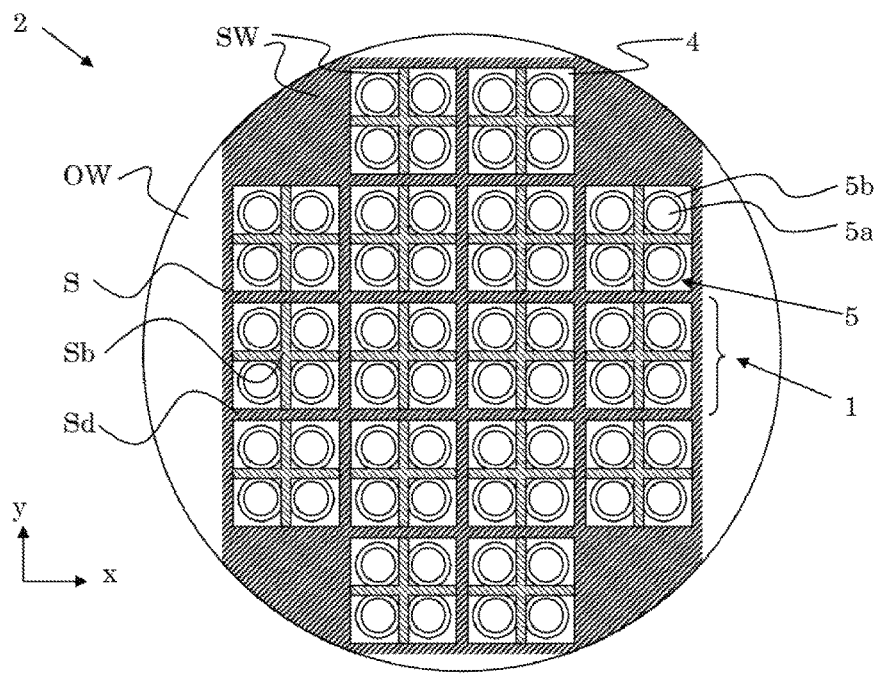
FIG. 10 a view onto a wafer stack.

FIG. 10 illustrates a view onto a wafer stack 2. It is a schematic illustration of a view onto wafer stack 2 for the manufacture of multi-channel opto-electronic modules. Each opto-electronic module which can be manufactured making use of this wafer stack 2 would comprise four channels, arranged in a 2×2 array. Optics wafer OW can, e.g., be transparent, comprising a multitude of optical structures 5. Spacer wafer SW laterally delimits the manufacturable opto-electronic modules. FIG. 10 may be interpreted as a view onto the wafer stack 2 of FIG. 8 with substrate wafer PW removed, and in a two times two channel configuration. Distancing portions Sd, structured portions Sb (both illustrated by different hatching) and open portions 4 are well visible, as are surrounding portions 5b and main portions 5a.

Figure 11:
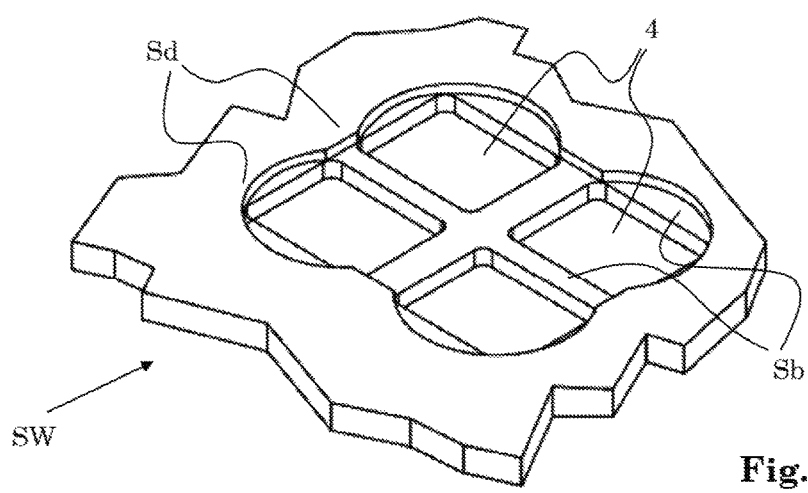
FIG. 11 a perspective view of a portion of a spacer wafer.

FIG. 11 is a perspective view of a portion of a spacer wafer SW, for two times two channels optical devices. The open portions 4 for one optical device are clearly laterally encompassed by structured portions Sb as well as by distancing portions Sd, the latter also encompassing the structured portions Sb for one optical device.

As has been announced above, in the following, further manufacturing methods and manufacturing steps will be described, and, more specifically, manufacturing methods and manufacturing steps concerning the manufacture of a spacer wafer (and thus also the manufacture of a spacer or separation member) will be described.

Figure 12:
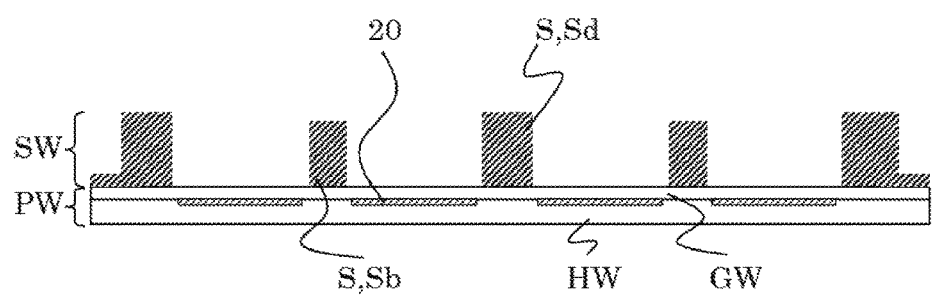
FIG. 12 a cross-sectional view of a spacer wafer replicated onto a substrate wafer.

FIG. 12 illustrates a cross-sectional view of a spacer wafer SW which is replicated onto a substrate wafer PW. This can be used for manufacturing a multitude of optical modules, e.g., of optical modules like those obtainable from the wafer stack illustrated in FIG. 7, or—with slight modifications—of other described optical modules or optical modules like those obtainable from other illustrated wafer stacks such as from the one illustrated in FIG. 8. For reasons of implicity and clearity, only two optical modules are illustrated. Of course, there will usually be more than the two modules per lateral (vertical) direction illustrated in FIG. 12.

The two wafers SW and PW form a contiguous part, and since a mutual fixing or attachment of the two wafers is already provided by the way of manufacturing spacer wafer SW, no additional bonding step is required.

Note that, of course, the spacers and in particular the spacer portions Sd might, in general, have a different shape, and that also the substrate wafer (and corresponding substrates) might be differently structured. Also the substrate PW may be structured differently. And furthermore, the illustrated principles apply as well when the spacer wafer SW is replicated onto another wafer such as on an optics wafer (instead of on a substrate wafer). The wafer onto which the spacer wafer SW is replicated can, generally, be referred to as base wafer, but in the illustrated example, we shall mostly refer to the spacer wafer, as an example for the base wafer.

Figure 13:
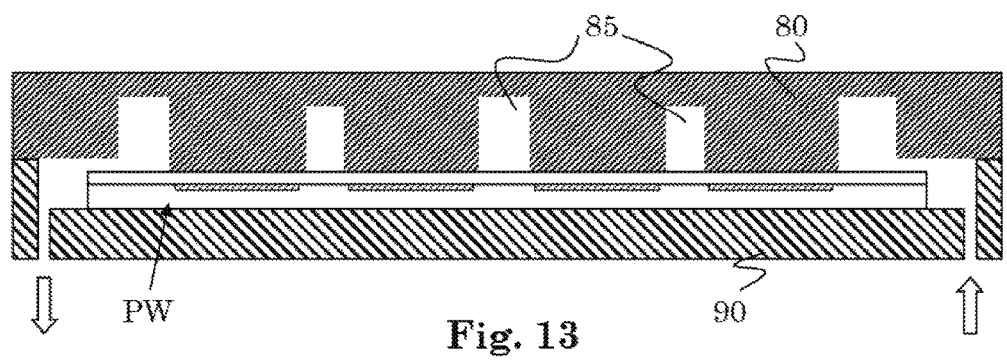
FIG. 13 an illustration of manufacturing method for manufacturing a structure as illustrated in FIG. 12.

FIG. 13 illustrates a manufacturing method for manufacturing a structure as the one illustrated in FIG. 12. On a first (vertical) side of the substrate wafer PW, a replication tool 80 is arranged, such that they are in contact with each other. The replication tool 80 has spacer replication structures 85. These are used for manufacturing the spacer wafer SW by replication. A vacuum sealing chuck 90 is brought in contact with the opposite (also vertical) side of substrate wafer PW. As schematically illustrated by the left open arrow in FIG. 13, a vacuum is applied to the vacuum sealing chuck 90 (via an outlet of vacuum sealing chuck 90). Close mechanical contacts between the vacuum sealing chuck 90, the substrate wafer 90 and the replication tool 80 may be accomplished this way. A replication material (usually of liquid, viscous or plastically deformable state) is injected through an inlet of the vacuum sealing chuck 90 (cf. the right open arrow in FIG. 13), e.g., an epoxy resin, in particular a light-blocking (non-transparent) material. The replication material fills the spaces defined by the spacer replication structures 85 (and the substrate wafer PW). By means of the applied vacuum, a void-free filling of the spaces between replication tool 80 and substrate wafer PW can be readily accomplished. Note that the spacer replication sections 85 (which basically describe a negative of the spacer portions Sd) may (and usually do) form an interconnected grid.

After hardening, in particular curing, the injected replication material, replication tool 80 and vacuum sealing chuck 90 can be removed, and substantially the structure illustrated in FIG. 12 is finished.

In some cases, it may be provided that another layer of material is provided between the base substrate and the vacuum sealing chuck 90, e.g., an elastic mat such as a silicone mat. This can be useful in particular in case the base wafer has protruding parts, which can be the case, e.g., when the base wafer is an optics wafer already provided with optical elements such as lens elements. Such lens elements (on the respective side of the optics wafer) would be protected from damage and/or too high pressure by the extra layer (elastic mat).

In another method, the spacer wafer SW is replicated (directly) onto a base wafer, too, but in addition, the same replication tool used for forming the spacer wafer SW is also used for manufacturing, by replication onto the base wafer, optical elements such as lens elements.

Figure 14:
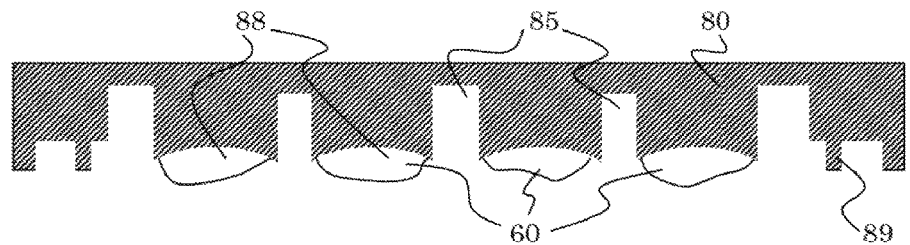
FIG. 14 a cross-sectional view of a replication tool having spacer replication sections and optical element replication sections.
Figure 15:
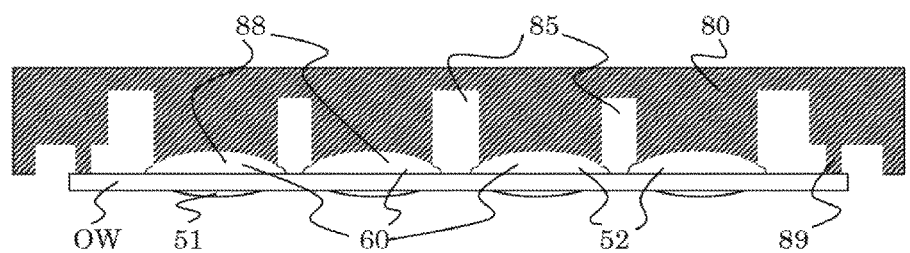
FIG. 15 an illustration of manufacturing steps.
Figure 16:
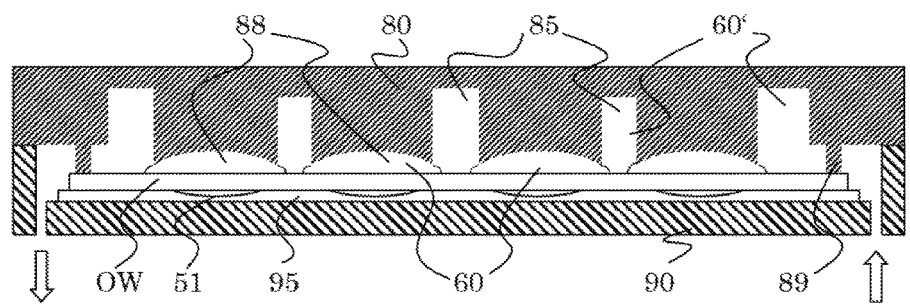
FIG. 16 an illustration of manufacturing steps.

FIGS. 14 to 16 illustrate such a method. FIG. 14 illustrates a replication tool 80 which has spacer replication sections 85 and optical element replication sections 88. FIG. 14 furthermore illustrates that replication material 60 is applied to the optical element replication sections 88. Thereafter, the replication tool 80 and an optics wafer OW (or a wafer to become optics wafer OW) are moved towards each other. Replication tool 80 may have, as illustrated in FIG. 15, mechanical stops 89 by means of which a suitable (desired) distance between the optical element replication sections 88 and a surface of optics wafer OW (or a wafer to become optics wafer OW) is ensured. On the opposite side, optical elements 51 may optionally be present already, as illustrated in FIG. 15. In this position, replication material 60 is hardened, e.g., cured. Replication material 60 usually will be transparent, e.g., a transparent epoxy resin. Thus, optical elements 52 are formed.

Then, a vacuum sealing chuck 90 is applied to the opposite side of the so-obtained optics wafer OW, wherein it is also possible to apply the vacuum sealing chuck 90 already before moving the wafer and the replication tool 80 towards each other. And it is optionally possible (as mentioned above in conjunction with FIGS. 12 and 13), to provide an elastic layer 95 (such as a silicone mat) between wafer and vacuum sealing chuck 90, cf. FIG. 16. Thereupon, the spacer wafer (with spacer portions) is formed on optics wafer OW in a way very similar to the way described in conjunction with FIGS. 12 and 13 (cf. also there): For accomplishing this, replication material 60' is injected into the space formed between optics wafer OW (cf. the open arrow in the right portion of FIG. 16) and replication tool 80. A vacuum (cf. the open arrow in the left portion of FIG. 16) may be applied in order to accomplish or at least facilitate this.

Thus, the spacer wafer is formed on optics wafer OW by replication material 60'. Typically still in this position, replication material 60' is hardened, e.g., by heat and/or UV radiation.

Replication material 60' may be identical with or different from replication material 60. In many cases, replication material 60' will be a non-transparent material, whereas replication material 60 will be a transparent material.

Removing replication tool 80 and vacuum sealing chuck 90 will result in the desired wafer combining the functionalities of both, spacer wafer and optics wafer.

In other words, in a first replication step, optical elements 52 are produced in an embossing-like step, and then (after hardening the optical elements 52), in a second replication step, the spacer wafer is produced on optics wafer OW in a molding-like step. For both these replication steps, one and the same replication tool 80 is used. Of course, later on, a separating step will usually take place in order to obtain single optical devices.

Optics wafer OW and the spacer wafer form a contiguous part, and since a mutual fixing or attachment of the two wafers is already provided by the way of manufacturing spacer wafer, no additional bonding step is required.

Structures described in the present patent application, cf., e.g., FIGS. 1, 6, 7, 8, 9, may be obtained using a process as described above. Of course, it is possible to use in the above process fully transparent optics wafers (cf., e.g., wafers OW in FIGS. 7-9 and wafer OW' in FIG. 9) or optics wafers having transparent portions and one or more blocking portions (cf., e.g., wafer OW in FIG. 3).

The manufacturing methods illustrated in the present patent application are well suitable to be carried out on wafer scale which is highly efficient and can allow high-quality high-throughput mass production. Miniscule optical devices, in particularly cameras (for still photography or for video), of high optical quality can be manufactured.

An exemplary opto-electronic module which in particular may be useful in or as a multi-channel optical sensor, more particularly in or as a multi-aperture camera, comprises N≥2 optical structures and N active optical components, wherein each of said N active optical components is assigned to and aligned with respect to one of said N optical structures. And laterally between neighboring active optical components and neighboring passive optical components, structured portions of the spacer are provided.

The invention claimed is:

1. A method for manufacturing one or more optical devices, each comprising a first member and a second member and, arranged between said first and second members, a third member referred to as spacer, each of said spacers comprising:
   one or more portions referred to as distancing portions in which the spacer has a vertical extension referred to as maximum vertical extension;
   at least two separate portions referred to as open portions in which no material of the spacer is present; and
   one or more portions referred to as structured portions in which material of the spacer is present and in which the spacer has a vertical extension smaller than said maximum vertical extension;
the method comprising:
b') manufacturing a wafer referred to as spacer wafer, said spacer wafer comprising a multitude of said spacers;
wherein step b') comprises
b1) providing a replication tool having spacer replication sections;
b2) providing a base wafer;
b3) bringing said replication tool in contact with a first surface of said base wafer;
b4) bringing a vacuum sealing chuck into contact with a second surface of said base wafer while said base wafer remains in contact with said replication tool; and
b5) injecting a liquid, viscous or plastically deformable material through an inlet of said vacuum sealing chuck so as to substantially fill said spacer replication sections.

2. The method according to claim 1, wherein said spacer wafer is fixed to said base wafer in step b').

3. The method according to claim 1, wherein said vacuum sealing chuck is in contact with said replication tool during step b5).

4. The method according to claim 1, comprising after step b5)
   b6) hardening the injected liquid, viscous or plastically deformable material.

5. The method according to claim 4, comprising after step b6)
   b7) releasing said base wafer, having the hardened injected liquid, viscous or plastically deformable material thereon from the replication tool and the vacuum sealing chuck.

6. The method according to claim 1, wherein said base wafer is a substrate wafer comprising a multitude of active optical components.

7. The method according to claim 1, wherein said base wafer is an optics wafer comprising a multitude of passive optical components.

8. The method according to claim 7, comprising
   c1) manufacturing said multitude of optical elements using a replication process.

9. The method according to claim 1, wherein said spacer wafer and said base wafer are stacked along a vertical axis, and wherein each of said spacers is located in a different one of a multitude of first laterally defined regions along a lateral axis perpendicular to the vertical axis.

10. The method according to claim 1, wherein said spacer wafer and said base wafer are stacked along a vertical axis, and wherein said open portions are disposed along a lateral axis perpendicular to the vertical axis.

11. The method according to claim 1, wherein said first member comprises at least two passive optical components, each of said at least two passive optical components extending vertically along a range referred to as vertical lens range, at least one of said structured portions extending into said vertical lens range.

12. The method according to claim 1, comprising forming a wafer stack comprising the spacer wafer, a wafer referred to as optics wafer, and a wafer referred to as substrate wafer, wherein said spacer wafer and said optics wafer and said substrate wafer are stacked along a vertical axis, and said spacer wafer is arranged between said optics wafer and said substrate, wherein said wafer stack comprises a multitude of portions referred to as device portions, each of said device portions being located in one of a multitude of second laterally defined regions which are free from mutual overlap and that are disposed along a lateral axis perpendicular to the vertical axis.

13. The method according to claim 11, comprising forming a wafer stack comprising the spacer wafer, a wafer referred to as optics wafer, and a wafer referred to as substrate wafer, wherein said spacer wafer is arranged between said optics wafer and said substrate, the method further comprising
   f) separating said wafer stack into a multitude of said optical devices.

14. A method for manufacturing a multitude of optical devices, each comprising:
   a first member comprising a replicated optical element;
   a second member; and
   a third member referred to as spacer, which is arranged between said first and second members;
each of said spacers comprising:
   one or more portions referred to as distancing portions in which the spacer has a vertical extension referred to as maximum vertical extension;
   at least two separate portions referred to as open portions in which no material of the spacer is present; and one or more portions referred to as structured portions in which material of the spacer is present and in which the spacer has a vertical extension smaller than said maximum vertical extension;

the method comprising manufacturing using replication a wafer comprising a multitude of said first members and a multitude if said spacers, said manufacturing using replication comprising:

g1) providing a replication tool having optical element replication sections and spacer replication sections;

g2) providing a first liquid, viscous or plastically deformable material onto the optical element replication sections of the replication tool;

g3) bringing a wafer referred to as base wafer into contact with the replication tool so that the first liquid, viscous or plastically deformable material is pressed between a first surface of the base wafer and the optical replication sections;

g4) hardening the first liquid, viscous or plastically deformable material to form said optical elements on the first surface of the base wafer;

g5) bringing a vacuum sealing chuck into contact with a second side of the base wafer while the base wafer remains in contact with the replication tool;

g6) injecting a second liquid, viscous or plastically deformable material through an inlet of said vacuum sealing chuck so as to substantially fill said spacer replication sections;

g7) hardening the second liquid, viscous or plastically deformable material.

15. The method according to claim 14, wherein the first material is a transparent material and the second material is a non-transparent material.

16. A method for manufacturing a spacer wafer on an optics wafer, the optics wafer comprising a multitude of passive optical components, the method comprising:

using a replication tool for manufacturing said spacer wafer; and using said replication tool for manufacturing said multitude of passive optical components, wherein the spacer wafer, as formed by the replication tool, is made of a non-transparent material, and wherein the passive optical components, as formed by the replication tool, are made of a transparent material.

17. The method according to claim 16, wherein the replication tool has optical element replication sections and spacer replication sections.

* * * * *